United States Patent
Ao et al.

(10) Patent No.: US 6,976,042 B2
(45) Date of Patent: Dec. 13, 2005

(54) LOW COST WHITE NOISE GENERATOR

(75) Inventors: Jiening Ao, Suwanee, GA (US);
Thai-Bao H. Kien, Norcross, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 659 days.

(21) Appl. No.: 10/138,688

(22) Filed: May 3, 2002

(65) Prior Publication Data

US 2003/0208516 A1    Nov. 6, 2003

(51) Int. Cl.[7] ................................................. G06J 1/00
(52) U.S. Cl. ........................................ 708/3; 341/110
(58) Field of Search ...................... 708/3, 255; 341/110

(56) References Cited

U.S. PATENT DOCUMENTS

| | | | | |
|---|---|---|---|---|
| 4,051,469 A | * | 9/1977 | Ninomiya | 341/110 |
| 6,608,579 B2 | * | 8/2003 | Kurooka | 341/144 |
| 6,624,773 B2 | * | 9/2003 | Wong | 341/136 |
| 6,721,352 B2 | * | 4/2004 | Kien et al. | 375/216 |

\* cited by examiner

Primary Examiner—Tan V. Mai

(57) ABSTRACT

A low cost white noise generator. An oscillator provides a signal to an analog-to-digital (A/D) converter for digitizing. A bit-order reversal circuit reverses the order of the received bits, wherein the reversal circuit provides bits having an order ranging from LSB to MSB. A digital-to-analog (D/A) converter subsequently converts the reversed digital signal back to an analog signal, which is a white noise signal due to the random nature of reversing the bits provided by the A/D converter.

5 Claims, 3 Drawing Sheets

LOW COST WHITE NOISE GENERATOR

FIELD OF THE INVENTION

This invention relates generally to test equipment, and more specifically to a low cost white noise generator that is suitable for use in characterizing the performance of a variety of electronics equipment that operate within a communications system, such as a cable television system.

BACKGROUND OF THE INVENTION

It is known that noise generators that are used to simulate noise are available for purchase from many vendors. Noise generators are typically used in a testing environment for testing and calibration purposes. Manufacturing facilities and communications systems use noise generators to simulate white noise in a testing environment in order to simulate a real-world communications system. More specifically, electronic equipment that is installed throughout a communications system, such as a cable television (CATV) system, needs to effectively operate within a standard noise level that exists in the system. Therefore, in manufacturing facilities, noise generators are used to ensure adequate designs of the electronics equipment to operate within a certain noise criteria of the electronics equipment. In communications systems, noise generators are used to ensure the noise level of the system is not excessive and outside the manufacturing criteria that may interfere with accurate signal processing. For example, noise generators are used relative to the reverse path of a system to test the noise power ratio (NPR).

Noise generators, however, are extremely expensive, for example, ranging around $14,000 each. Not many generators are typically required per manufacturing facility or communications system, thereby limiting the costs. The present invention, however, is directed towards providing an extremely low cost noise generator that can replace the traditionally purchased noise generator.

BRIEF DESCRIPTION OF THE DRAWINGS

FIG. 3 is a block diagram illustrating a system under test using the noise generator of FIG. 1.

DETAILED DESCRIPTION OF A PREFERRED EMBODIMENT

The present invention will be described more fully hereinafter with reference to the accompanying drawings in which like numerals represent like elements throughout the figures, and in which an exemplary embodiment of the invention is shown. This invention may, however, be embodied in many different forms and should not be construed as limited to the embodiments set forth herein; rather, the embodiment is provided so that this disclosure will be thorough and complete, and will fully convey the scope of the invention to those skilled in the art. For example, the present invention is detailed and explained relative to a noise generator that is used to simulate noise that is inherently present and generated in a communications system; however, the present invention is not limited to a communications system and can be utilized for simulation wherever noise signals are required. The present invention is described more fully hereinbelow.

Figure 1:
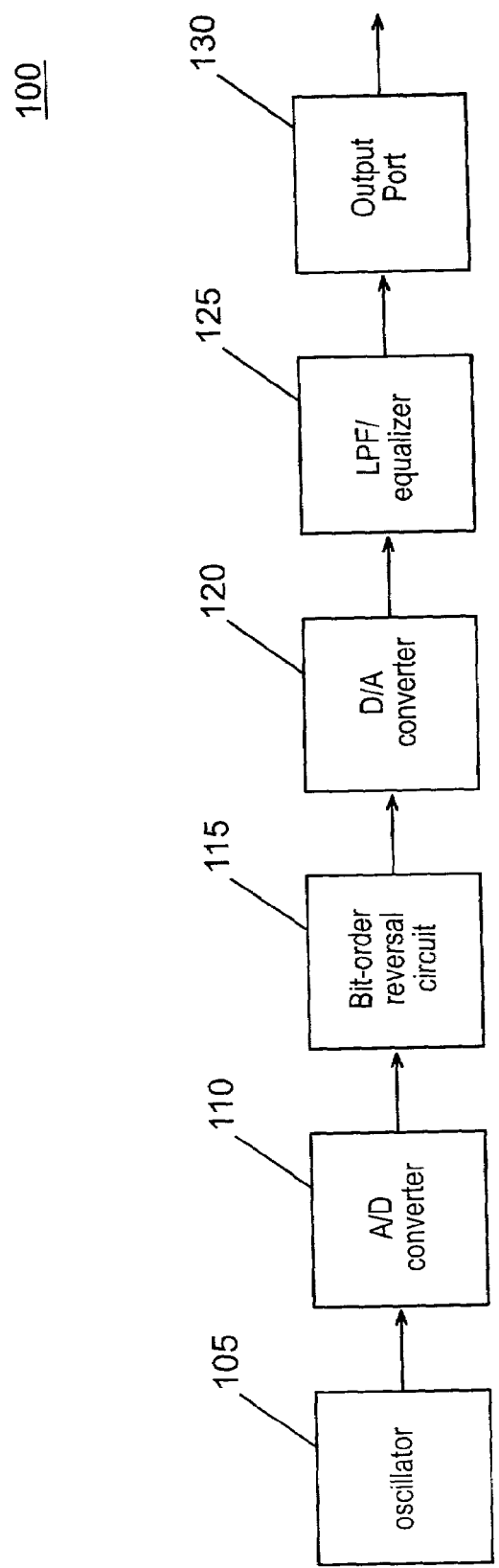
FIG. 1 is a block diagram illustrating an example of a low cost noise generator in accordance with the present invention.

FIG. 1 is a block diagram illustrating an example of a low cost noise generator 100 in accordance with the present invention. As mentioned hereinabove, the noise generator 100 of the present invention replaces the requirement for a purchased noise generator. The noise generator 100 of the present invention includes such components to output a noise signal, also known as white noise, that can be used to simulate white noise that is present in a real-world environment. Typically, conventional methods of designing noise generators have included using a noise diode or using a digital random number generator followed by a digital-to-analog converter. Notably, the costs for these designs are extremely high due to the complexity of the building components. The present invention is an improvement to the conventional noise generators in that the assembled cost to the manufacturer is approximately $50 compared to the conventional purchase price of approximately $14,000. This is a significant drop in cost, thereby encouraging manufacturing companies and communications system to purchase the present invention over the conventional noise generators.

As shown in FIG. 1, an oscillator 105 is used to provide a sine wave signal or any other deterministic signal. An analog-to-digital (A/D) converter 110 digitizes the sine wave signal. Subsequently, a bit-order reversal circuit 115 reverses the order of the bits comprising the digital signal. More specifically, the bit-order reversal circuit 115 can simply be hard-wired to reverse the input least significant bit (LSB) to become the output most significant bit (MSB) and the input MSB as the output LSB. Every bit therebetween is also reversed in its bit order. A digital-to-analog (D/A) converter 120 receives the bit-order reversed signal and converts the digital signal back to an analog signal. A lowpass filter and equalizer 125 are optionally used to prevent aliasing generated by the A/D and D/A converters 110, 125 from passing through with the desired signal. The equalizer may also be included to compensate for any D/A converter rolloff due to the inherent sin x/x response that may also affect the output signal. An output port 130 provides the noise signal to the system under test.

As an example, the components that are suitable for use to assemble a noise generator 100 to achieve an output noise signal ranging from direct current (DC) to 50 Mega Hertz (MHz) may be as follows. A sinusoidal waveform generator 105 that outputs a sine wave signal having +30 dBmV is provided to a 10-bit A/D converter 110 that samples the signal at 100 MHz. The output digital signal that ranges in bits from 9:0, is reversed by the reversal circuit 115 to provide at its output an output digital signal that ranges in bits from 0:9. Subsequently, a 10-bit D/A converter 120 that is clocked at 100 MHz converts the signal back to an analog signal, which is also a noise signal. A 50 MHz lowpass filter and equalizer 125 can be used to filter any aliases from the noise signal and flatten the output spectrum. Accordingly, an output noise signal is provided in the range from DC to 50 MHz. It will be appreciated that the components used in this example can be altered to achieve an output noise signal of any range. For example, when the A/D and D/A converters sample the signal at 200 MHz, the noise generator 100 provides an output noise signal ranging from DC to 100 MHz. Additionally, a sub-sampling technique can be used to provide a bandpass noise signal. Notably, the flexibility and ease of the design of the present invention 100 provides the users a low-cost and extremely versatile product.

Figure 2:
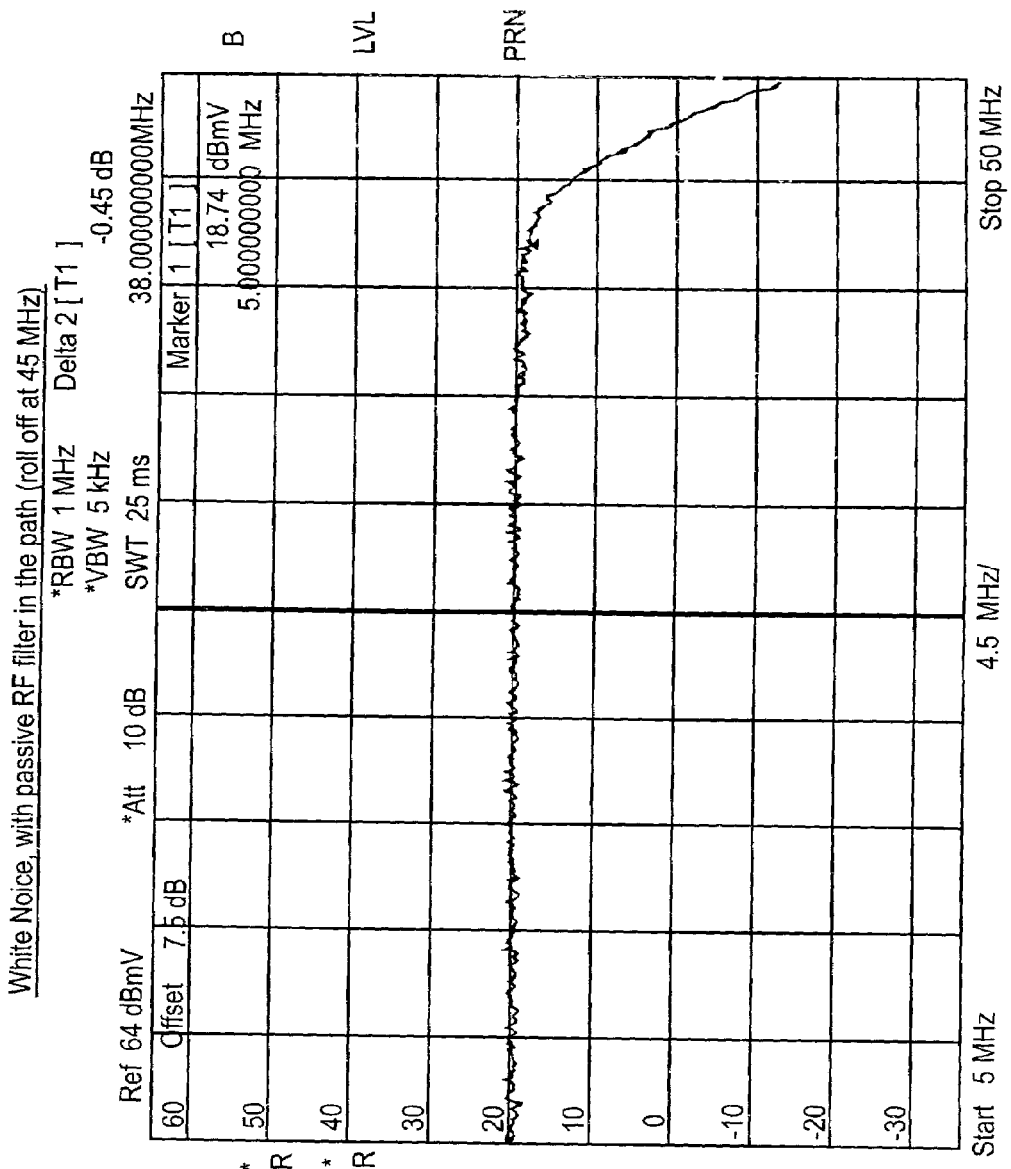
FIG. 2 illustrates a noise signal that is provided by the noise generator of the present invention.
Figure 1:
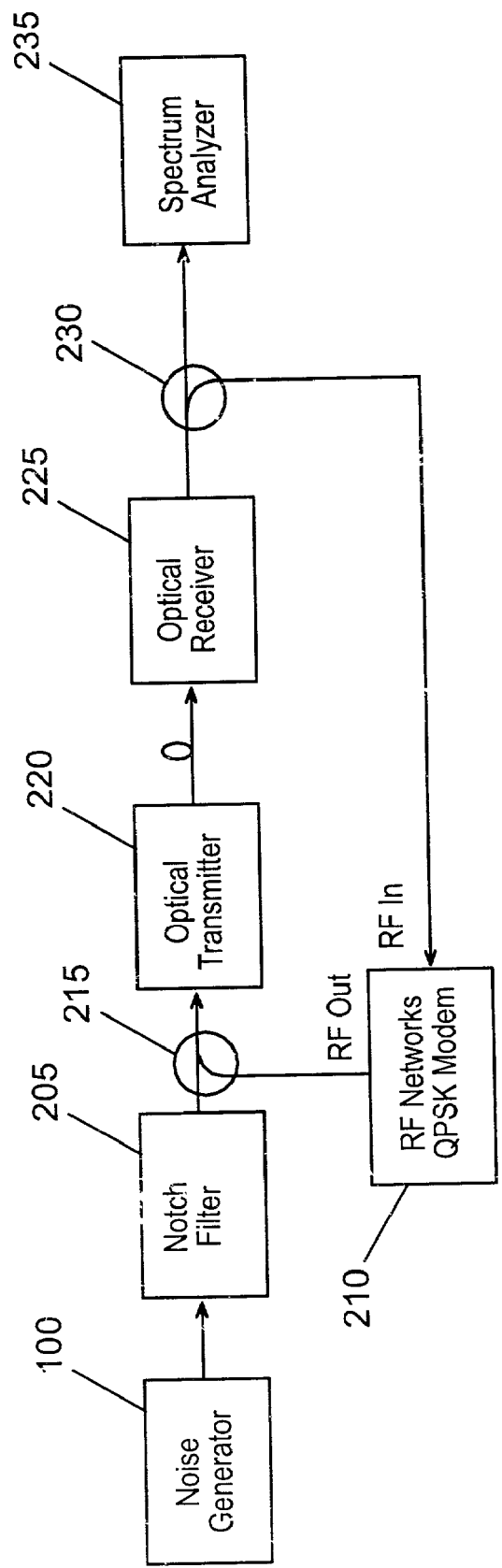

Importantly, the bit-order reversal circuit 115 is a key component to the invention. After digitization, the reversal circuit 115 reverses the bit order, thereby providing a random digital signal due to the random nature in the LSB becoming the MSB. As mentioned, this circuit 115 can simply be achieved by hard-wiring the output bits of the A/D converter 110 to reverse the bits to the input of the D/A converter 120. It will be appreciated, however, that other techniques can be used to reverse the order of the bits, but may add more complexity and increase costs of the noise generator 100. The output of the D/A converter 120 is then random, or noisy. This noise signal can subsequently be used in a testing environment to simulate a noise level that exists within a communications system. FIG. 2 illustrates a noise signal as visualized by a spectrum analyzer that is provided by the noise generator 100 of the present invention.

FIG. 3 is a block diagram illustrating a system under test using the noise generator of FIG. 1, which replaces the conventional noise generator. The noise generator 100 provides the noise signal to a notch filter 205, which filters the noise signal to a desired frequency range depending upon the requirements of the test. A coupler 215 couples the filtered noise signal with a radio frequency (RF) signal. The RF signal is provided by an RF networks quadrature phase-shift keying (QPSK) modem 210, for example. The RF signal is the conventional signal used in a cable television system. A conventional optical transmitter 220 converts the combined signal to an optical signal. After transmission of the optical signal over optical fiber, an optical receiver 225 converts the signal back to an electrical signal in a known manner. A splitter 230 splits the electrical signal and provides a portion of the signal to the QPSK modem 210 in order to loop back through the test setup. The remaining portion is provided to a spectrum analyzer 235 for a visual interpretation of the noise to power ratio. In this manner, the noise generator 100 of the present invention simulates real-world noise that exists in a communications system in order to test the electronics equipment, i.e., the optical transmitter 220 and optical receiver 225.

In summary, the noise generator 100 of the present invention is a significantly easier apparatus to design and manufacture. The cost of the present invention 100 compared with the costs of the conventional generators is a dramatic difference. It will be appreciated that the present invention 100 can be purchased as an assembled product from a manufacturer or can alternatively be self-designed and assembled.

What is claimed is:

1. A noise generator comprising:
   an oscillator for outputting a deterministic signal;
   an analog-to-digital (A/D) converter for digitizing the deterministic signal, wherein the digital signal includes a predetermined number of bits;
   a bit-order reversal circuit for reversing the order of the bits; and
   a digital-to-analog (D/A) converter for converting the digital signal back to an analog signal,
   wherein the output of the D/A converter is a noise signal.

2. The noise generator of claim 1, further comprising:
   a low pass filter for filtering any aliases of the analog signal; and
   an equalizer for compensating for any roll-off associated with the analog signal.

3. A method of generating noise signals, the method comprising the steps of:
   providing a deterministic signal;
   digitizing the deterministic signal to provide a digital signal, the digital signal comprising a predetermined number of bits having an order ranging from MSB to LSB;
   reversing the order of the bits to provide a reversed digital signal wherein the bits have an order ranging from LSB to MSB; and
   converting the reversed digital signal to an analog signal, wherein the analog signal is the noise signal.

4. The method of claim 3, the steps further comprising:
   filtering the analog signal to filter any aliases that from the digitizing step and provide the filtered noise signal that is within a desired bandwidth.

5. An apparatus for generating a white noise signal that is suitable for use in a testing environment, the apparatus comprising:
   an analog-to-digital converter for digitizing an input signal and for providing a digital signal, wherein the A/D converter samples the input signal at a predetermined sample rate, and wherein the digital signal comprising a predetermined number of bits;
   a reversal circuit for reversing the order of the bits and for providing a reversed bit-order digital signal;
   a digital-to-analog converter for converting the reversed bit-order digital signal to an analog signal, wherein the analog signal is the white noise signal.

* * * * *

UNITED STATES PATENT AND TRADEMARK OFFICE
CERTIFICATE OF CORRECTION

| | |
|---|---|
| PATENT NO. | : 6,976,042 B2 |
| APPLICATION NO. | : 10/138688 |
| DATED | : December 13, 2005 |
| INVENTOR(S) | : Jiening Ao and Thai-Bao H. Kien |

It is certified that error appears in the above-identified patent and that said Letters Patent is hereby corrected as shown below:

Title Page #57, Abstract, line 2, change "(AID)" to --(A/D)--.

Signed and Sealed this

Third Day of April, 2007

JON W. DUDAS
*Director of the United States Patent and Trademark Office*